(12) United States Patent
Sakaguchi (10) Patent No.: US 6,417,545 B1
(45) Date of Patent: Jul. 9, 2002

(54) SEMICONDUCTOR DEVICE (75) Inventor: Sadanori Sakaguchi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/544,598

(22) Filed: Apr. 6, 2000

(30) Foreign Application Priority Data

Sep. 27, 1999 (JP) .......................... 11-272268 P (51) Int. Cl.[7] .............................................. H01L 29/76
(52) U.S. Cl. ........................ 257/368; 257/390; 365/154
(58) Field of Search .......................... 257/393; 365/154

(56) References Cited

U.S. PATENT DOCUMENTS 5,359,226 A * 10/1994 DeJong ....................... 257/773
5,731,618 A    3/1998 Ishigaki
5,798,551 A    8/1998 Kikushima et al.
6,163,054 A * 12/2000 Kim ............................ 257/344
6,169,313 B1 * 1/2001 Tsutsumi et al. ............ 257/390

FOREIGN PATENT DOCUMENTS

JP         5-41458      2/1993
JP         10-135355    5/1998

* cited by examiner

Primary Examiner—Douglas A. Wille
(74) Attorney, Agent, or Firm—McDermott, Will & Emery (57) ABSTRACT Contact holes which reach source/drain regions shared by access transistors and driver transistors are formed in a self-alignment manner with a silicon nitride film for covering gate electrodes. Therefore, contact plugs formed in the contact holes have an L plan shape. As a result, a semiconductor device including an SRAM can be obtained in which the transistor performance of both the access transistors and the driver transistors is improved and the difference in voltage dependence properties between the driver transistors and the load transistors is improved.

7 Claims, 7 Drawing Sheets

SEMICONDUCTOR DEVICE

BACKGROUND OF THE INVENTION

1. Field of the Invention

The present invention relates to a semiconductor device which includes a static random access memory having an access transistor and a driver transistor.

2. Description of the Background Art

Conventionally, the technique of opening a contact hole, which is formed in a self-alignment manner with a protection insulation film for covering a gate electrode, is used in a static random access memory (hereinafter, referred to as an SRAM). A conventional SRAM will be described in the following with reference to FIGS. 7 to 9.

Figure 7:
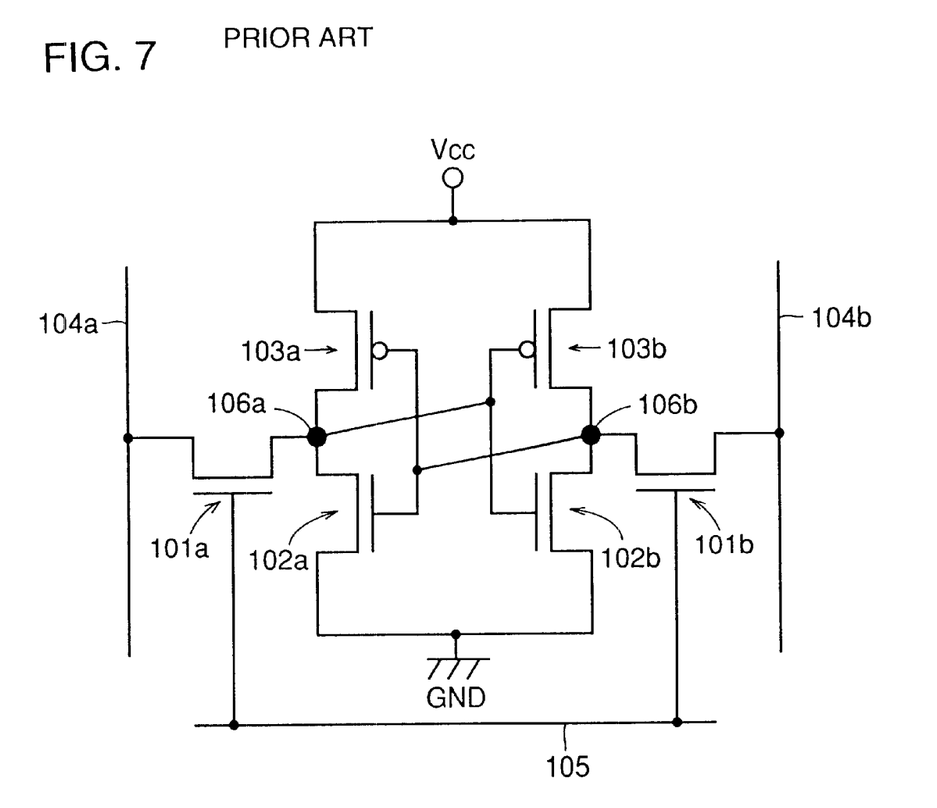
FIG. 7 is a schematic circuit diagram showing an SRAM.

An SRAM memory cell will be first described with reference to an equivalent circuit diagram shown in FIG. 7. A load transistor 103a and a driver transistor 102a are connected in series between a power supply electrode Vcc and a ground electrode GND. A load transistor 103b and a driver transistor 102b are also connected in series between power supply electrode Vcc and ground electrode GND. In other words, load transistor 103a and driver transistor 102a are connected in parallel with load transistor 103b and driver transistor 102b. The gate electrode of load transistor 103a is connected to the gate electrode of driver transistor 102a by an inter-gate interconnection. The gate electrode of load transistor 103b is also connected to the gate electrode of driver transistor 102b by an inter-gate interconnection.

The source/drain electrode of an access transistor 101a is connected to a portion for forming a storage electrode 106a between load transistor 103a and driver transistor 102a. The source/drain electrode of an access transistor 101b is connected to a portion for forming a storage electrode 106b between load transistor 103b and driver transistor 102b.

Further, storage electrode 106a is connected to the inter-gate interconnection between load transistor 103b and driver transistor 102b, and storage electrode 106b is connected to the inter-gate interconnection between load transistor 103a and driver transistor 102a. The gate electrodes of access transistors 101a, 101b are connected to a word line 105. The source/drain electrodes of access transistors 101a, 101b are connected to bit lines 104a, 104b, respectively.

Figure 8:
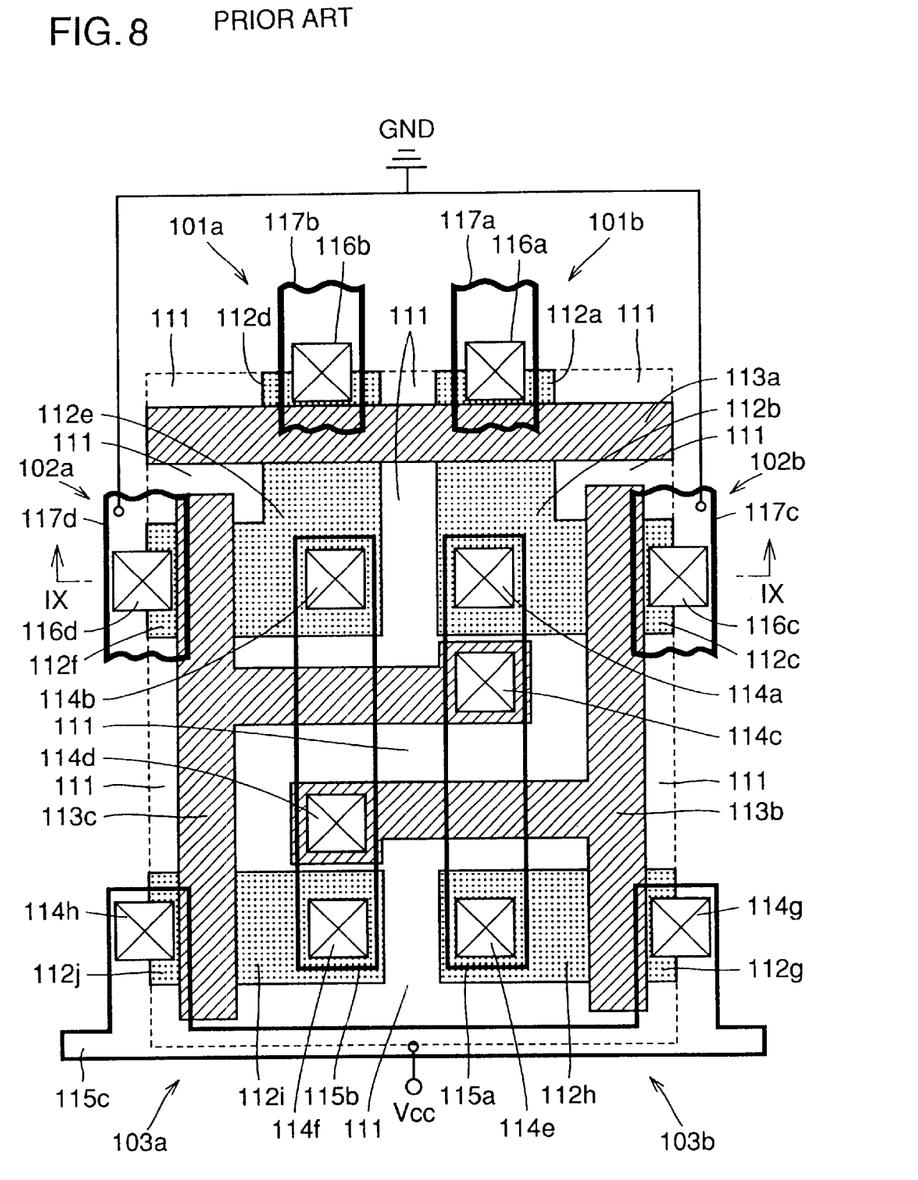
FIG. 8 schematically shows a plan structure of a conventional SRAM.

A plan view of the SRAM structure will be described in the following. In FIG. 8, a region surrounded by a dash line corresponds to one memory cell. In the memory cell region, two access transistors 101a, 101b, two driver transistors 102a, 102b, and two load transistors 103a, 103b are formed.

On the main surface of the semiconductor substrate, the following impurity diffusion regions are formed. They are source/drain regions 112d, 112a of access transistors 101a, 101b, source/drain regions 112f, 112c of driver transistors 102a, 102b, source/drain regions 112e, 112b shared by access transistors 101a, 101b and driver transistors 102a, 102b, and source/drain regions 112i, 112j, 112g, 112h of load transistors 103a, 103b.

Source/drain regions 112a, 112b, 112c, 112d, 112e, 112f are n-type active regions. Source/drain regions 112g, 112h, 112i, 112j are p-type active regions. On the semiconductor device, an isolation insulation film 111 is formed in a region other than source/drain regions 112a, 112b, 112c, 112d, 112e, 112f, 112g, 112h, 112i, 112j inside the dash line.

Gate electrodes which are each formed of the one-layer structure of a polycrystalline silicon film or the two-layer structure of a polycrystalline silicon film and a silicide film are formed as described below. A gate electrode 113a is formed between source/drain regions 112a, 112d and source/drain regions 112b, 112e. A gate electrode 113b is formed between source/drain regions 112c, 112g and source/drain regions 112b, 112h. A gate electrode 113c is formed between source/drain regions 112f, 112j and source/drain regions 112e, 112i.

First contact plugs 114a, 114b are connected to source/drain regions 112b, 112e. First contact plugs 114d, 114c are connected to gate electrodes 113b, 113c. First contact plugs 114g, 114e, 114f, 114h are connected to source/drain regions 112g, 112h, 112i, 112j. A first metallic interconnection layer 115a is connected to the top surfaces of first contact plugs 114a, 114c, 114e. A first metallic interconnection layer 115b is connected to the top surfaces of first contact plugs 114b, 114d, 114f. A first metallic interconnection layer 115c is connected to the top surfaces of first contact plugs 114g, 114h. A first metallic interconnection layer 115c is connected to power supply electrode Vcc.

Second contact plugs 116a, 116b, 116c, 116d, which are formed in a self-alignment manner with a silicon nitride film (not shown) for covering gate electrodes 113a, 113b, 113c, are connected to source/drain regions 112a, 112c, 112d, 112f. Second metallic interconnection layers 117a, 117b, 117c, 117d are formed on the top surfaces of second contact plugs 116a, 116b, 116c, 116d.

A sectional structure of the conventional SRAM having the above described plan structure will be described in the following. As can be seen from FIG. 9 for illustrating the sectional structure taken along line IX—IX in FIG. 8, a semiconductor substrate 121 has a p-type well 122 which is formed from the main surface to a prescribed depth. An isolation insulation film 111 for isolating and forming element formation regions is formed from the position of a prescribed height from the main surface of semiconductor substrate 121 to the position of a prescribed depth in semiconductor substrate 121.

Figure 9:
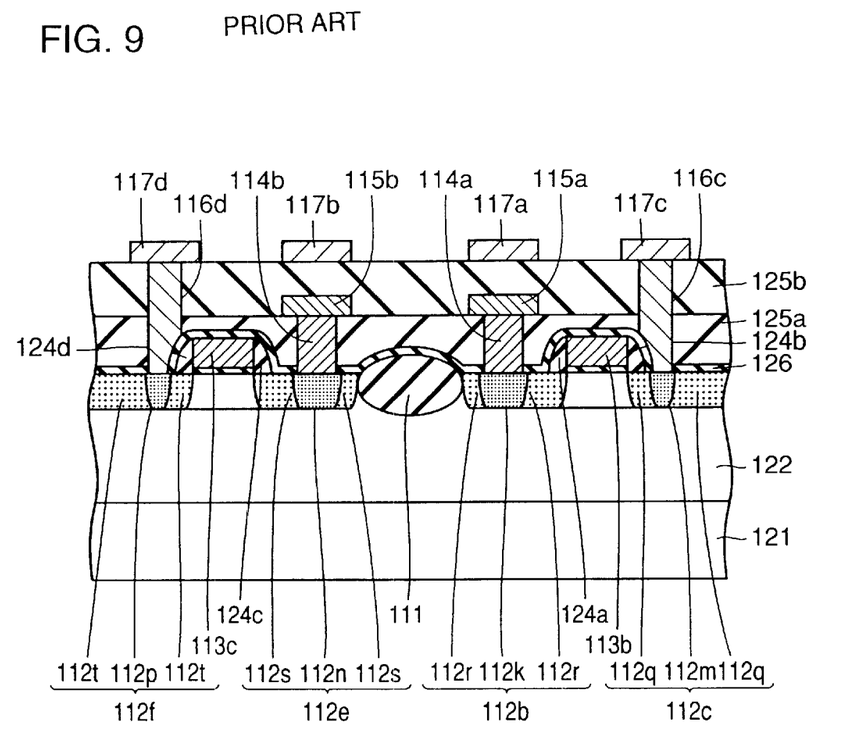
FIG. 9 shows a sectional structure along line IX—IX in FIG. 8.

In the element formation regions, gate electrodes 113b, 113c are formed on the main surface of semiconductor substrate 121 with a gate insulation film therebetween. Sidewall nitride films 124a, 124b, 124c, 124d are formed on the sidewalls of gate electrodes 113b, 113c. In the element formation regions, n⁻ impurity regions 112q, 112r, 112s, 112t of a relatively low impurity concentration and n⁺ impurity regions 112n, 112k, 112m, 112p of a relatively high impurity concentration are formed from the main surface of semiconductor substrate 121 to a prescribed depth. Here, n⁻ impurity region 112q and n⁺ impurity region 112m form source/drain region 112c, n⁻ impurity region 112r and n⁺ impurity region 112k form source/drain region 112b, n⁻ impurity region 112s and n⁺ impurity region 112n form source/drain region 112e, and n⁻ impurity region 112t and n⁺ impurity region 112p form source/drain region 112f.

A silicon nitride film 126 is formed to cover gate electrodes 113b, 113c, sidewall nitride films 124a, 124b, 124c, 124d, isolation insulation film 111, and the main surface of semiconductor substrate 122. An interlayer insulation film 125a is formed on silicon nitride film 126.

In contact holes which pass through interlayer insulation film 125a and silicon nitride film 126 and reach n⁺ impurity regions 112n, 112k, first contact plugs 114a, 114b are formed. First metallic interconnection layers 115a, 115b are formed to connect to the top surfaces of first contact plugs 114a, 114b. An interlayer insulation film 125b is formed to cover first metallic interconnection layers 115a, 115b and interlayer insulation film 125a. In contact holes which pass through interlayer insulation films 125a, 125b and silicon nitride film 126 and reach n⁺ impurity regions 112m, 112p, second contact plugs 116c, 116d are formed. Second metallic interconnection layers 117c, 117d are formed to connect to the top surfaces of second contact plugs 116c, 116d. Second metallic interconnection layers 117a, 117b are formed on interlayer insulation film 125b above first metallic interconnection layers 115a, 115b.

In the above described conventional SRAM, the contact holes in which first contact plugs 114a, 114b as storage nodes are formed are also used as openings to implant impurities, in a self-alignment manner, into source/drain regions 112b, 112e shared by access transistors 101a, 101b. By this impurity implantation, high concentration impurity regions are formed in the source/drain regions.

In order to increase the response speed of a transistor, a high concentration impurity region has to be placed as close to its gate electrode as possible. In the conventional SRAM, however, the contact holes for forming first contact plugs 114a, 114b are not formed in a self-alignment manner with silicon nitride film 126 which covers gate electrodes 113a, 113b, 113c.

Therefore, if the plan positions of the contact holes for forming first contact plugs 114a, 114b are made closer to either access transistors 101a, 101b or driver transistors 102a, 102b, the performance is varied between access transistors 101a, 101b and driver transistors 102a, 102b. On the side of a gate electrode to which the contact hole for forming first contact plug 114a, 114b is formed closer, the high concentration impurity region is also formed closer to the gate electrode. Therefore, the length of the low concentration impurity region between the gate electrode and the first contact plug is reduced. As a result, the response speed of the transistor becomes higher. On the side of a gate electrode from which the contact hole for forming first contact plug 114a, 114g is formed farther, the high concentration impurity region is also formed farther from the gate electrode. Therefore, the length of the low concentration impurity region between the gate electrode and the first contact plug is increased. As a result, the response speed of the transistor becomes lower. Thus, improvement in the performance of one of the access transistor and the driver transistor deteriorates the performance of the other.

In order to provide the high concentration impurity regions close to gate electrodes 113b, 113c of driver transistors 102a, 102b, for example, the contact holes for forming first contact plugs 114a, 114b are opened in places for from gate electrode 113a of access transistors 101a, 101b. In this case, since source/drain regions 112b, 112e are each formed to an L shape in the SRAM as shown in FIG. 8, the high concentration impurity regions are formed far from access transistors 101a, 101b. Therefore, the length of the low concentration impurity region between gate electrode 113a and the high concentration impurity region is increased. In other words, electric resistance between gate electrode 113a and first contact plugs 114a, 114b is increased. It deteriorates the transistor performance of access transistors 101a, 101b.

Since the distance for providing the high concentration impurity regions close to gate electrodes 113b, 113c of driver transistors 102a, 102b is varied by an error which is caused in the manufacturing process, voltage dependence properties become different between driver transistors 102a, 102b and load transistors 103a, 103b. Therefore, a semiconductor device which cannot ensure sufficient margins for writing and reading voltages may be manufactured.

If the contact holes for forming the first contact plugs are formed close to gate electrode 113a of access transistors 101a, 101b, the transistor performance of driver transistors 102a, 102b is deteriorated and the voltage dependence properties are varied between driver transistors 102a, 102b and load transistors 103a, 103b for each semiconductor device for the same reason.

In order to solve the above problems, two contact holes for forming first contact plugs 114a, 114b may be formed close to each of the side of access transistors 101a, 101b and the side of driver transistors 102a, 102b. However, such a structure increases the memory cell region. Further, a prescribed distance has to be ensured between first metallic interconnection layers 115a, 115b and other conductive layers not to cause short circuit. In the conventional SRAM, however, first metallic interconnection layers 115a, 115b are connected to cover the entire upper surfaces of first contact plugs 114a, 114b. If first contact plugs 114a, 114b are placed excessively close to gate electrodes 113a, 113b, 113c, therefore, first metallic interconnection layers 115a, 115b are short-circuited with second contact plugs 116a, 116b, 116c, 116d. It is therefore difficult to form first contact plugs 114a, 114b closer to gate electrode 113a of access transistors 101a, 101b or close to gate electrodes 113b, 113c of driver transistors 102a, 102b.

SUMMARY OF THE INVENTION

An object of the present invention is to provide a semiconductor device including an SRAM in which the transistor performance of both access transistors and driver transistors is improved and the difference in the voltage dependence properties between driver transistors and load transistors for each semiconductor device is improved.

According to the present invention, a semiconductor device including a static random access memory having an access transistor and a driver transistor on a main surface of a semiconductor substrate includes a gate electrode of the access transistor, a gate electrode of the driver transistor, a source/drain region shared by the access transistor and the driver transistor, a first insulation film covering the surface of the gate electrode of the access transistor, a second insulation film covering the surface of the gate electrode of the driver transistor, an interlayer insulation film formed to cover the main surface of the semiconductor substrate, the surface of the first insulation film, and the surface of the second insulation film, a contact hole formed in a self-alignment manner with the first and second insulation films, the contact hole passing through the interlayer insulation film and reaching the source/drain region, a conductive contact plug formed in the contact hole, and a high concentration impurity region having a higher impurity concentration than surrounding regions and formed to be in contact with the entire bottom surface of the contact plug in the source/drain region.

According to such a structure, the contact hole is formed in a self-alignment manner with the first and second insulation films. Thus, the first and second insulation films ensure insulation between the contact plug and the gate electrodes of the access transistor and the driver transistor, and the contact hole in which the contact plug is formed has its bottom surface formed at a position which is closest to both the gate electrodes of the access transistor and the driver transistor. Therefore, the high concentration impurity region in contact with the entire bottom surface of the contact plug is not formed closer to either the access transistor or the driver transistor if impurities are implanted in a self-alignment manner from the contact hole. In other words, the high concentration impurity region is formed close to the gate electrodes of the access transistor and the driver transistor. As a result, the length of the low concentration impurity region of a relatively low concentration which is formed around the high concentration impurity region in the source/drain region is small on both sides of the access transistor and the driver transistor. Electrons move faster between the first contact plug, which is connected to the source/drain region shared by the access transistor and the driver transistor, and the transistors. Therefore, the transistor performance is improved for both the access transistor and the driver transistor.

Since the contact hole is formed in a self-alignment manner with the second insulation film which covers the gate electrode of the driver transistor, the bottom surface of the contact hole is formed at a prescribed position even if there is an error of the mask opening portion. Therefore, the high concentration impurity region which is formed of impurities implanted from the contact hole is formed at a prescribed position. Thus, the voltage dependence properties of the driver transistor are stabled. Therefore, the possibility of causing a difference in the voltage dependence properties between the driver transistor and the load transistor can be reduced.

In the semiconductor device according to the present invention, a first axis and a second axis may be defined to cross on the main surface of the semiconductor substrate, the source/drain region may be formed along the first axis and the second axis at a crossing of the axes, the gate electrode of the access transistor may be formed on the first axis, and the gate electrode of the driver transistor may be formed on the second axis.

Even in such an SRAM structure having the access transistor and the driver transistor not formed on a straight line, the effects of the above described semiconductor device can be obtained if the contact hole is opened which is formed in a self-alignment manner with both the access transistor and the driver transistor as described above. According to such a semiconductor device structure, therefore, the degree of freedom increases for the plan layout of the SRAM- If the crossing angle of the first and second axes is optimally set, for example if the access transistor and the driver transistor are formed to be almost perpendicular to the source/drain regions shared by the both transistors, a compact plan layout can be obtained.

In the semiconductor device according to the present invention, the contact hole may be formed along the first and second axes at their crossing when viewed from above.

According to such a structure, implantation of high concentration impurities from the contact hole can form the high concentration impurity region in the source/drain region to conform to the shape of the source/drain region. Therefore, the high concentration impurity region can be formed only in a region which has minimum influence on other regions. The contact plug formed in the contact hole can also be formed in the source/drain region to conform to the shape of the source/drain region. Therefore, the contact plug can be formed efficiently in a region which has minimum influence on other interconnection layers.

More preferably, the semiconductor device according to the present invention further includes a conductive layer which is formed to extend from the top surface of the interlayer insulation film to and come into contact with part of the region on the top surface of the contact plug.

According to such a structure, the conductive layer is formed on part of the top surface of the contact plug, and therefore the conductive layer can be formed only to a place which is spaced apart from other conductive layers by a prescribed distance. Thus, the distance between other conductive materials and the conductive layer can be at least a prescribed value. It can prevent undesirable influence mutually exerted between other conductive materials and the conductive layer or short-circuiting of other conductive materials and the conductive layer.

In the semiconductor device according to the present invention, the contact plug and the conductive layer are formed of the same material.

According to such a structure, the state of interface contact between the contact plug and the conductive layer does not become poor as in the case where the contact plug and conductive layer are formed of different materials. As a result, electric conductance increases between the contact plug and the conductive layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described with reference to the drawings.

First Embodiment

Figure 1:
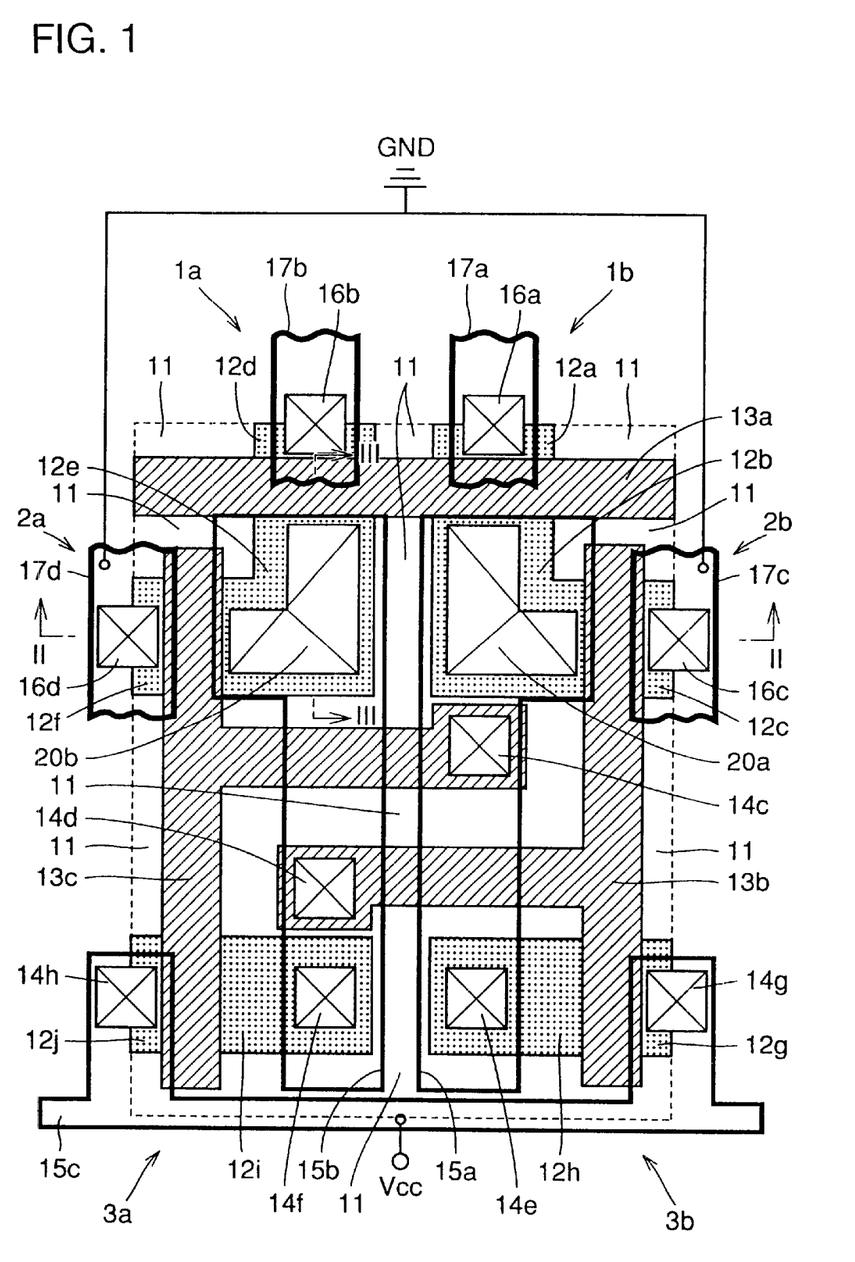
FIG. 1 schematically shows a plan structure of an SRAM in a first embodiment of the present invention.
Figure 2:
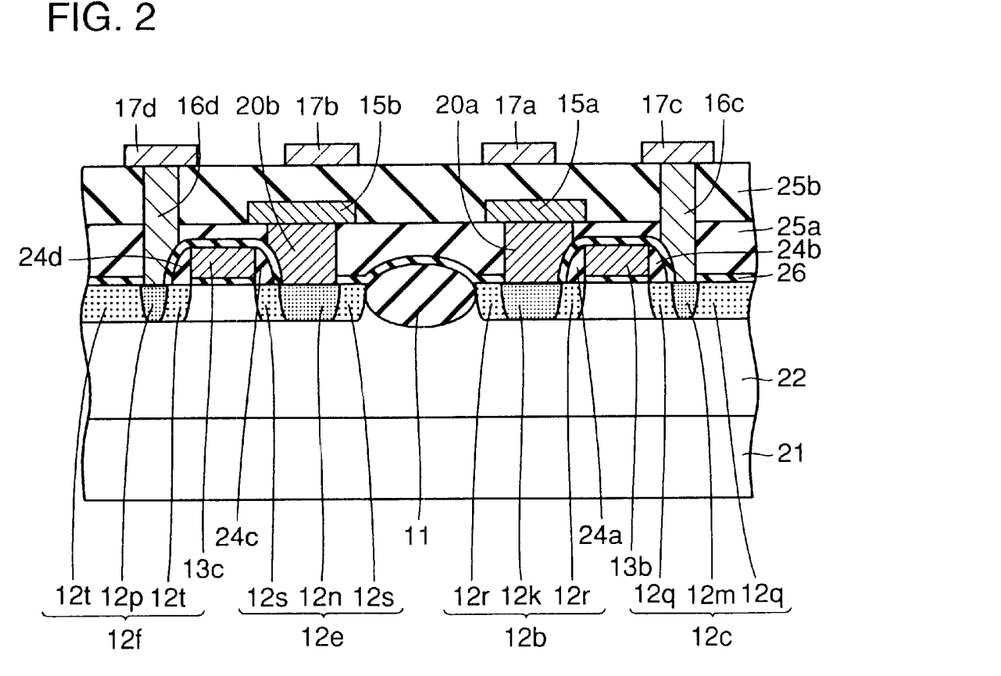
FIG. 2 shows a sectional structure along line II—II in FIG. 1.

A semiconductor device including an SRAM in a first embodiment of the present invention will be described with reference to FIGS. 1 and 2. A plan structure of the SRAM will be described with reference to FIG. 1. In FIG. 1, a region surrounded by a dash line corresponds to one memory cell. In the memory cell region, two access transistors 1a, 1b, two driver transistors 2a, 2b, and two load transistors 3a, 3b are formed.

Further, source/drain regions 12a, 12d of access transistors 1a, 1b as well as source/drain regions 12c, 12f of driver transistors 2a, 2b are formed. L-shaped source/drain regions 12b, 12e are formed which are shared by access transistors 1a, 1b and driver transistors 2a, 2b. Source/drain regions 12g, 12h, 12i, 12j of load transistors 3a, 3b are formed.

Source/drain regions 12a, 12b, 12c, 12d, 12e, 12f are n⁻ type active regions. Source/drain regions 12g, 12h, 12i, 12j are p-type active regions. An isolation insulation film 11 is formed in a region on the semiconductor substrate other than source/drain regions 12a, 12b, 12c, 12d, 12e, 12f, 12g, 12h, 12i, 12j on the semiconductor substrate inside the dash line.

Gate electrodes which are each formed of the one-layer structure of a polycrystalline silicon film or the two-layer structure of a polycrystalline silicon film and a silicide film are formed as described below. A gate electrode 13a is formed between source/drain regions 12a, 12b and source/drain regions 12b, 12e. A gate electrode 13b is formed between source/drain regions 12c, 12g and source/drain regions 12b, 12h. A gate electrode 13c is formed between source/drain regions 12f, 12j and source/drain regions 12e, 12i.

Source/drain regions 12b, 12e are connected to first contact plugs 20a, 20b which are each of an L shape when viewed from above to conform to the shapes of source/drain regions 12b, 12e. First contact plugs 20a, 20b are filled in contact holes which are formed in a self-alignment manner with a silicon nitride film (not shown) for covering gate electrodes 13b, 13c. First contact plugs 14d, 14c are connected to gate electrodes 13b, 13c. First contact plugs 14g, 14h which are formed in a self-alignment manner with a silicon nitride film (not shown) for covering gate electrodes 13b, 13c are connected to source/drain regions 12c, 12j. First contact plugs 14d, 14f are connected to source/drain regions 12h, 12i. A first metallic interconnection layer 15a is connected to the top surfaces of first contact plugs 20a, 14c, 14e. A first metallic interconnection layer 15b is connected to the top surfaces of first contact plugs 20b, 14d, 14f. A first metallic interconnection layer 15c is connected to the top surfaces of fist contact plugs 14g, 14h. First metallic interconnection layers 15c is connected to a power supply Vcc.

Second contact plugs 16a, 16b, 16c, 16d which are formed in a self-alignment manner with a silicon nitride film (not shown) for covering the surfaces of gate electrodes 13a, 13b, 13c are connected to source/drain regions 12a, 12d, 12c, 12f. Second metallic interconnection layers 17a, 17b, 17c, 17d are formed on the top surfaces of second contact plugs 16a, 16b, 16c, 16d.

Figure 3:
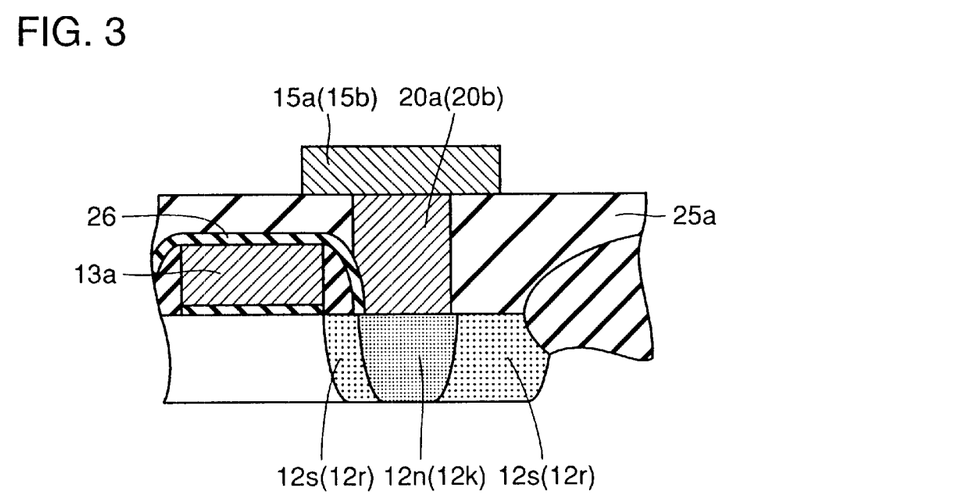
FIG. 3 shows a sectional structure along line III—III in FIG. 1.

The SRAM sectional structure of the present invention having the above described structure will be described in the following with reference to FIG. 2 for showing a sectional structure along line II—II in FIG. 1 and FIG. 3 for showing a sectional structure along line III—III in FIG. 1. As shown in FIG. 2, a semiconductor substrate 21 has a p-type well 22 formed from the main surface to a prescribed depth. An isolation insulation film 11 for isolating and forming element formation regions is formed from the position of a prescribed height from the main surface of semiconductor substrate 21 to the position of a prescribed depth in semiconductor substrate 21.

In the element formation regions, gate electrodes 13b, 13c are formed on the main surface of semiconductor substrate 21 with a gate insulation film therebetween. Sidewall nitride films 24a, 24b, 24c, 24d are formed on the sidewalls of gate electrodes 13b, 13c. In the element formation regions, n⁻ impurity regions 12q, 12r, 12s, 12t of a relatively low impurity concentration and n⁺ impurity regions 12n, 12k, 12m, 12p of a relatively high impurity concentration which form source/drain regions 12c, 12b, 12e, 12f in FIG. 1 are formed from the main surface of semiconductor substrate 21 to a prescribed depth. A silicon nitride film 26 is formed to cover gate electrodes 13b, 13c, sidewall nitride films 24a, 24b, 24c, 24d, isolation insulation film 11, and the main surface of semiconductor substrate 21. An interlayer insulation film 25a is formed on silicon nitride film 26.

Contact holes which pass through interlayer insulation film 26 and reach n⁺ impurity regions 12k, 12n are formed in a self-alignment manner with silicon nitride film 26. In the contact holes, first contact plugs 20a, 20b are formed. First metallic interconnection layers 15a, 15b are formed on the top surfaces of first contact plugs 20a, 20b. An interlayer insulation film 25b is formed to cover first metallic interconnection layers 15a, 15b and interlayer insulation film 25a. In contact holes which pass through interlayer insulation films 25a, 25b and reach n⁺ impurity regions 12m, 12p, second contact plugs 16c, 16d are formed. Second metallic interconnection layers 17c, 17d are formed on the top surfaces of second contact plugs 16c, 16d. Second metallic interconnection layers 17a, 17b are formed on interlayer insulation film 25b above first metallic interconnection layers 15a, 15b. Although not shown, the contact holes which pass through the interlayer insulation film and reach n⁺ impurity regions 12k, 12n are also formed in a self-alignment manner with silicon nitride film 26 for covering gate electrode 13a of access transistors 1a, 1b as shown in FIG. 3.

According to such a structure, the contact holes which are connected to high concentration impurity regions 12k, 12n are formed in a self-alignment manner with silicon nitride film 26 for covering gate electrodes 13a, 13b, 13c. Thus, sidewall nitride films 24a, 24c and silicon nitride film 26 ensure insulation between contact plugs 20a, 20b and gate electrodes 13a, 13b, 13c of access transistors 1a, 1b and driver transistors 2a, 2b, and the contact holes in which contact plugs 20a, 20b are formed have their bottom surfaces formed closest to both gate electrode 13a of access transistors 1a, 1b and gate electrodes 13b, 13c of driver transistors 2a, 2b. Therefore, high concentration impurity regions 12k, 12n in contact with the entire bottom surfaces of contact plugs 20a, 20b are not formed to be biased to access transistors 1a, 1b or driver transistors 2a, 2b if impurities are implanted from the contact holes in a self-alignment manner. In other words, high concentration impurity regions 12k, 12n are formed close to gate electrodes 13a, 13b, 13c of access transistors 1a, 1b and driver transistors 2a, 2b. Therefore, the length of low concentration impurity regions 12s, 12r of a relatively low concentration which are formed in the vicinity of gate electrodes 13a, 13b, 13c in source/drain regions 12b, 12e are small on the sides of both access transistors 1a, 1b and driver transistors 2a, 2b. Therefore, electrons move faster between first contact plugs 20a, 20b, which are connected to source/drain regions 12b, 12e shared by access transistors 1a, 1b and driver transistors 2a, 2b, and their respective transistors. As a result, the transistor performance is improved for both access transistors 1a, 1b and driver transistors 2a, 2b.

Since the contact holes are formed in a self-alignment manner with silicon nitride film 26 for covering gate electrodes 13b, 13c of driver transistors 2a, 2b, the bottom surfaces of the contact holes are formed at prescribed positions even if there is an error of a mask opening portion. Therefore, high concentration impurity regions 12k, 12n which are formed of impurities implanted from the contact holes are formed at prescribed positions. It stabilizes the voltage dependence properties of driver transistors 2a, 2b. It can therefore reduce the possibility of causing a difference in the voltage dependence properties of driver transistors 2a, 2b and load transistors 3a, 3b for each semiconductor device.

Even in an SRAM structure in which access transistors 1a, 1b and driver transistors 2a, 2b are not formed on a straight line, the above described effects can be obtained by opening contact holes which are formed in a self-alignment manner with silicon nitride film 26 for covering gate electrodes 13a, 13b, 13c of access transistors 1a, 1b and driver transistors 2a, 2b. Thus, the degree of freedom increases for the plan layout of an SRAM. If access transistors 1a, 1b and driver transistors 2a, 2b are formed almost perpendicular to source/drain regions 12b, 12e shared by the transistors as in the above described SRAM, a compact plan layout can be obtained.

If impurities are implanted from the contact holes to form high concentration n$^+$ impurity regions 12k, 12n, n$^+$ impurity regions 12k, 12n can be formed in source/drain regions to conform to the shapes of the source/drain regions. Therefore, n$^+$ impurity regions 12k, 12n can be formed only in regions which have minimum influence on other regions. If first contact plugs 20a, 20b which are formed in the contact holes are also formed in source/drain regions 12b, 12e to conform to the shapes of source/drain regions 12b, 12e, their influence on other regions can be minimized.

Second Embodiment

Figure 4:
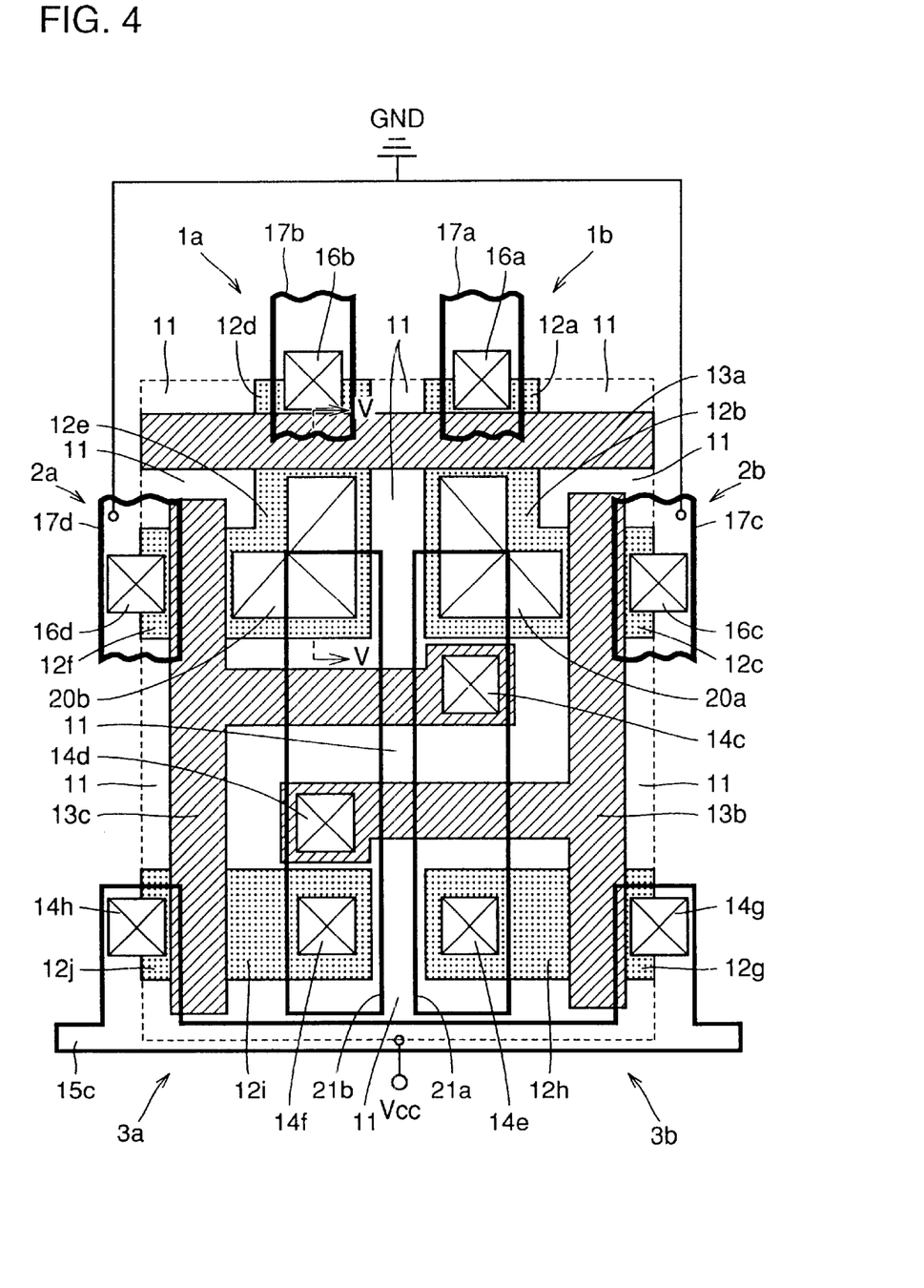
FIG. 4 schematically shows a plan structure of an SRAM in a second embodiment of the present invention.

A semiconductor device in a second embodiment of the present invention will be described in the following with reference to FIG. 4. The structure of the semiconductor device in this embodiment is similar to that of the semiconductor device shown in FIG. 1 in the first embodiment. As shown in FIG. 4, however, the semiconductor device in this embodiment is different in that first metallic interconnection layers 21a, 21b which cover only part of the top surfaces of first contact plugs 20a, 20b are connected to the top surfaces of first contact plugs 20a, 20b.

According to such a structure, first metallic interconnection layers 21a, 21b are formed only on part of the top surfaces of first contact plugs 20a, 20b. Therefore, first metallic interconnection layers 21a, 21b can be each formed only to such a place that is spaced apart by a prescribed distance from the place where second contact plugs 16a, 16b, 16c, 16d are formed. Thus, the distance between second contact plugs 16a, 16b, 16c, 16d and first metallic interconnection layers 21a, 21b can be at least a prescribed value. It can prevent undesirable influence mutually exerted between second contact plugs 16a, 16b, 16c, 16d and first metallic interconnection layers 21a, 21b or short-circuiting of second contact plugs 16a, 16b, 16c, 16d and first metallic interconnection layers 21a, 21b.

Third Embodiment

Figure 5:
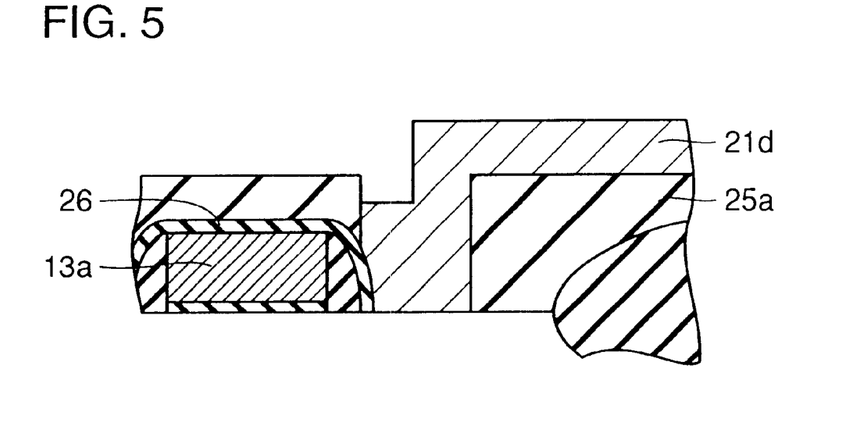
FIG. 5 shows a sectional structure along line V—V in FIG. 4 in an SRAM in a third embodiment of the present invention.

A semiconductor device in a third embodiment of the present invention will be described in the following with reference to FIGS. 5 and 6. In the second embodiment, first metallic interconnection layers 21a, 21b are formed in contact with the top surfaces of first contact plugs 20a, 20b. In this embodiment, however, an interconnection layer 21d is provided as shown in FIG. 5, instead of first metallic interconnection layers 21a, 21b and first contact plugs 20a, 20b, which is made by integrally forming a first contact plug portion and a first metallic interconnection layer portion using the same material.

In the second embodiment, first contact plugs 20a, 20b and first metallic interconnection layers 21a, 21b are formed of different materials. If the state of interface contact between first contact plugs 20a, 20b and first metallic interconnection layers 21a, 21b is poor, therefore, electric conductance may be deteriorated between first contact plugs 20a, 20b and first metallic interconnection layers 21a, 21b.

In this embodiment, however, interconnection layer 21d which is made by integrally forming the first contact plug portion and the first metallic interconnection layer portion using the same material is formed instead of first contact plugs 20a, 20b and first metallic interconnection layers 21a, 21b in the second embodiment. Thus, the electric conductance of interconnection layer 21d does not become poor. As a result, the semiconductor performance is improved.

Figure 6:
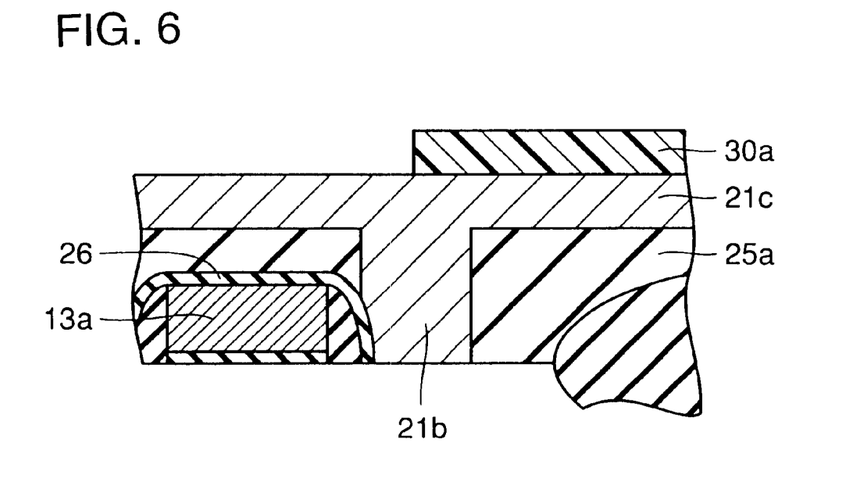
FIG. 6 is a view for illustrating a method of manufacturing the SRAM in the third embodiment of the present invention.

As a method of manufacturing the semiconductor device in this embodiment, as shown in FIG. 6, a contact hole is first filled, a first metallic interconnection layer portion 21c is integrally deposited on interlayer insulation film 25a using the same material as first contact plug portion 21b, and part of first contact plug portion 21b and first metallic interconnection layer portion 21c is etched away using a resist film 30a. Thus, interconnection layer 21d is formed including the fist contact plug portion and the first metallic interconnection layer portion which are integrally formed. As a result, the structure of the semiconductor device in this embodiment is formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device including a static random access memory having an access transistor and a driver transistor on a main surface of a semiconductor substrate, comprising:

a first axis and a second axis defined to cross on the main surface of the semiconductor substrate, a gate electrode of said access transistor formed on said first axis;

a gate electrode of said driver transistor formed on said second axis;

a source/drain region shared by said access transistor and said driver transistor formed along said first axis and said second axis at a crossing thereof;

a first insulation film covering a surface of the gate electrode of said access transistor;

a second insulation film covering a surface of the gate electrode of said driver transistor;

an interlayer insulation film formed to cover said main surface of said semiconductor substrate, a surface of said first insulation film, and a surface of said second insulation film;

a contact hole formed in a self-alignment manner with said first and second insulation films, the contact hole passing through said interlayer insulation film and reaching said source/drain region, wherein said contact hole is formed at a crossing of said first axis and said second axis and said contact hole is bent at the crossing of said first axis and said second axis from the direction of the first axis to the direction of the second axis; and a conductive contact plug formed in said contact hole.

2. The semiconductor device according to claim 1, further comprising a conductive layer formed to extend from a top surface of said interlayer insulation film and come into contact with a part of a top surface of said contact plug.

3. The semiconductor device according to claim 1, wherein said contact plug and said conductive layer are formed of the same material.

4. The semiconductor device according to claim 1, wherein said first axis and said second axis cross almost perpendicularly.

5. The semiconductor device according to claim 1, further comprising a high concentration impurity region having a higher impurity concentration than surrounding regions and formed in contact with the entire bottom surface of said contact plug in said source/drain region.

6. The semiconductor device according to claim 1, wherein said contact hole comprises first and second contiguous segments, wherein the first contiguous segment extends a greater distance along said first axis than said second axis and the second contiguous segment extends a greater distance along said second axis than said first axis.

7. The semiconductor device according to claim 1, wherein the contact plug is L-shaped.

* * * * *